United States Patent
Heinisch et al.

(10) Patent No.: US 6,727,555 B2
(45) Date of Patent: Apr. 27, 2004

(54) DEVICE FOR PROTECTING ELECTRONIC COMPONENTS

(75) Inventors: Holger Heinisch, Reutlingen (DE); Rainer Topp, Reutlingen (DE); Wolfgang Jacob, Horb (DE); Hans-Reiner Krauss, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/199,800

(22) Filed: Jul. 19, 2002

(65) Prior Publication Data

US 2003/0030072 A1 Feb. 13, 2003

(30) Foreign Application Priority Data

Jul. 19, 2001 (DE) .......................... 101 35 168

(51) Int. Cl.[7] .............................. H01L 23/62
(52) U.S. Cl. ........................ 257/355; 361/56; 361/91; 361/92; 361/111
(58) Field of Search .............................. 361/56, 91, 92, 361/111

(56) References Cited

U.S. PATENT DOCUMENTS 4,723,191 A * 2/1988 Menniti ..................... 361/92
5,640,299 A * 6/1997 Leach ........................ 361/56

* cited by examiner

*Primary Examiner*—David Nelms
*Assistant Examiner*—Mai-Huong Tran
(74) *Attorney, Agent, or Firm*—Kenyon & Kenyon

(57) ABSTRACT

A device for protecting electronic components against overvoltages of a supply voltage is provided, which device includes at least one semiconductor transistor which is switchable by a trigger circuit when a predetermined overvoltage value is reached, thereby converting electrical energy to thermal energy.

15 Claims, 6 Drawing Sheets

DEVICE FOR PROTECTING ELECTRONIC COMPONENTS

FIELD OF THE INVENTION

The present invention relates to a device for protecting electronic components against overvoltages of the supply voltage, and in particular, but without limitation, relates to protection of electronic components used in electronic systems in motor vehicles.

BACKGROUND INFORMATION

It is generally known that inductive loads, such as coils and the like, produce direct or indirect overvoltages. A particularly harmful overvoltage occurs, for example, in the case of a poor contact or momentary battery disconnection during generator operation (load dump). In the automotive sector, for example, overvoltages of up to 80 V can occur within a 400 ms period in the case of a 12 V supply voltage. These transients can destroy various electronic circuits, in the motor vehicle, such as integrated circuits, unless they are effectively protected against such overvoltages.

It is possible to prevent overvoltages of the electrical system of a motor vehicle from destroying the electronic components by designing the corresponding components according to the maximum voltage peaks that occur. However, this is extremely expensive and uneconomical.

It would therefore be advantageous to provide a protective device to protect components designed for normal operation against overvoltages of the generator supply voltage.

Currently, Zener diodes are used in conjunction with the generator, that permit only slight voltage variations even when the current varies greatly.

This approach has the disadvantage that the voltage present at the Zener diode has a wide tolerance range and is greatly dependent on the temperature present at the component. During a transition to a higher vehicle system voltage (as is being planned for mass production), for example, this tolerance and temperature dependency thus becomes too great for practical application.

SUMMARY OF THE INVENTION

The device according to an embodiment of the present invention has the advantage over known approaches that it is suitable for high vehicle system voltages and is reasonably inexpensive to produce, and that the device may be positioned to prevent polarity reversal. The device also has a low tolerance and a low temperature coefficient of the response threshold.

According to an embodiment of the present invention, the device includes at least one semiconductor transistor which is switchable by a trigger circuit upon reaching predetermined overvoltage values, thereby converting electrical energy to thermal energy and protecting electronic components against system voltage overvoltages.

By switching the overvoltages of the system voltage in a defined manner via the at least one semiconductor transistor, the load dump energy is converted to heat by the semiconductor component and the internal resistor of the supply voltage source, thus protecting the connected electronic components against damage by the original load dump energy.

According to an embodiment, the trigger circuit and the semiconductor transistor are provided as integrated circuits on a single chip.

According to another embodiment, the semiconductor transistor is electrically connectable in series to a Zener diode. The Zener diode stabilizes the voltage and coverts electrical overvoltage energy to thermal energy.

According to another embodiment, the semiconductor transistor and the Zener diode are provided as integrated circuits on two separate chips. In this case, the two chips may be either stacked or arranged side-by-side and then electrically interconnected.

According to another embodiment, the device is at least partially surrounded by at least one heat removal apparatus. This makes it possible to remove the heat generated in the semiconductor components from the components and to discharge it to the environment.

According to a further embodiment, at least one heat removal apparatus is designed as a metal body, a casting compound, for example an epoxy compound, and/or a metal receptacle. The one or more heat removal apparatuses may be placed into direct contact with the corresponding semiconductor components.

According to a further embodiment, the semiconductor transistor is designed as a MOSFET transistor, for example, a vertical power MOSFET transistor, having an integrated trigger circuit.

According to a further embodiment, the semiconductor transistor is designed as a vertical bipolar transistor having an integrated trigger circuit.

According to a further embodiment, the electrical connections of the device are designed as soldered connections and/or direct die bonding connections.

According to a further embodiment, the Zener diode is connected in series to a rectifier diode. This makes it possible to prevent the component from being damaged in the event of a polarity reversal, for example by using an $n^+$-p-n semiconductor component.

According to a further embodiment, the Zener diode and the rectifier diode are integrated into a three-layer semiconductor element.

According to a further embodiment, the device may be provided in an electronic system of a motor vehicle to protect the system components against overvoltages of the motor vehicle electrical system.

BRIEF DESCRIPTION OF THE DRAWINGS

FIG. 2 shows a detailed circuit diagram of the device according to the first exemplary embodiment shown in FIG. 1a.

FIG. 3b shows a schematic cross-sectional view of the rectifier diode shown in FIG. 3a.

DETAILED DESCRIPTION

Figure 1C:
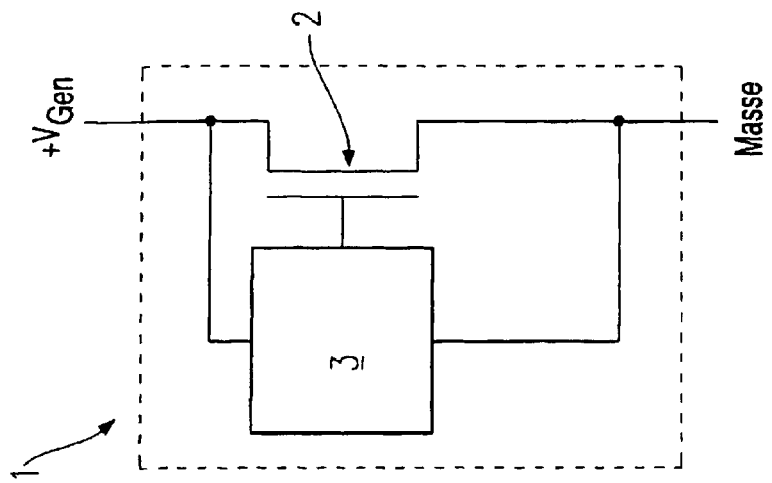
FIG. 1c shows a circuit diagram of the device according to a third exemplary embodiment of the present invention.
Figure 1B:
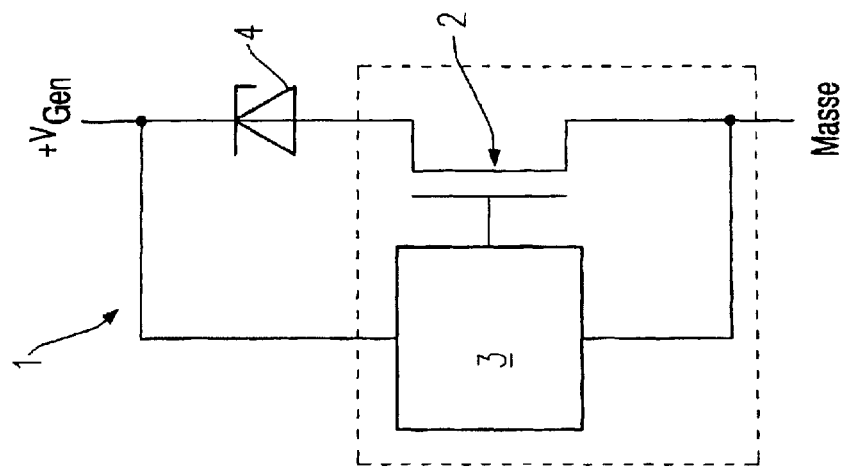
FIG. 1b shows a circuit diagram of the device according to a second exemplary embodiment of the present invention.
Figure 1A:
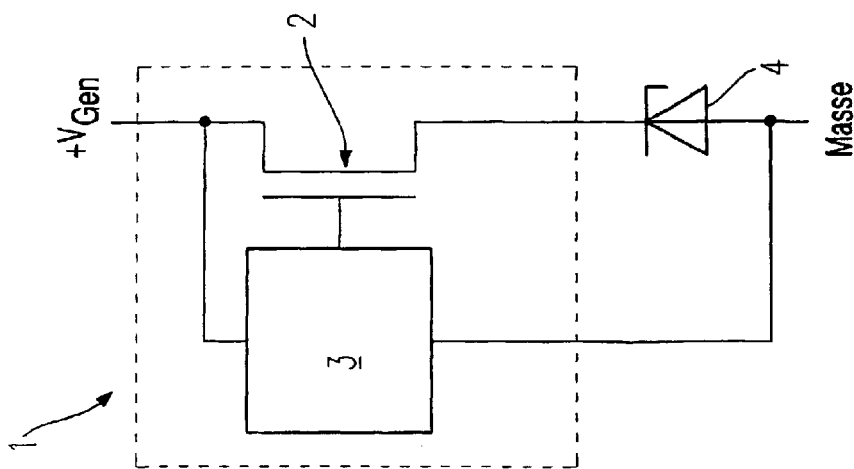
FIG. 1a shows a circuit diagram of the device according to a first exemplary embodiment of the present invention.
Figure 2:
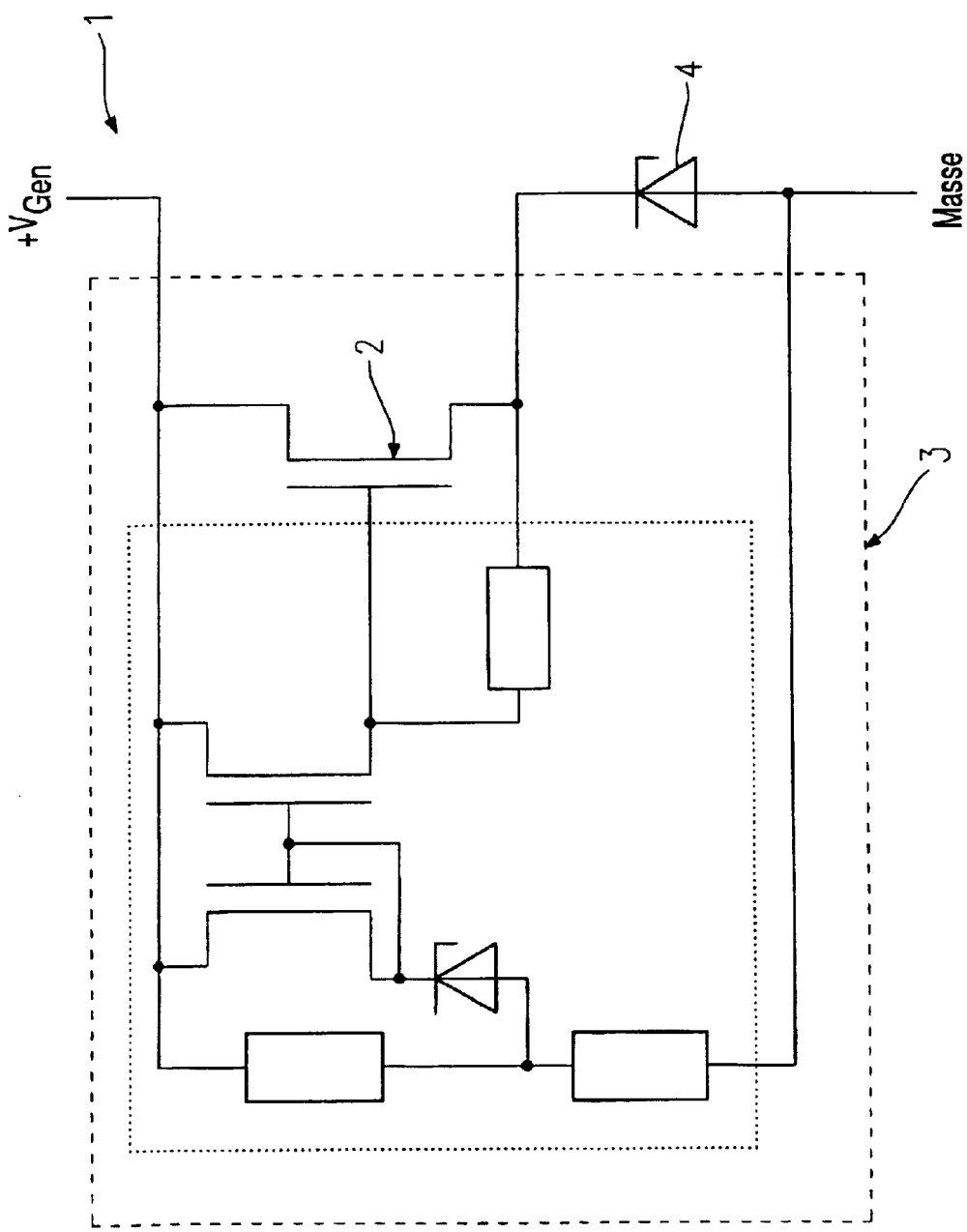

FIGS. 1a and 2 illustrate block diagrams of an exemplary circuit of a device 1 for protecting electronic components against overvoltages of generator voltage $V_{Gen}$ according to a first embodiment of the present invention.

A vertical power MOSFET transistor 2 is advantageously electrically connected to supply voltage source $V_{Gen}$, a trigger circuit 3 being connected to supply voltage source $V_{Gen}$ and MOSFET transistor 2. FIG. 2 shows a detailed illustration of trigger circuit 3 which activates or switches MOSFET transistor 2 when the overvoltage of supply voltage source $V_{Gen}$ reaches a predetermined voltage value.

A Zener diode 4 is also advantageously connected in series to MOSFET transistor 2. Thus, when trigger circuit 3 activates MOSFET transistor 2 upon reaching a predetermined overvoltage value, semiconductor components 2, 4 and the internal resistor of supply voltage source $V_{Gen}$ convert electrical overvoltage energy (load dump energy), according to the first exemplary embodiment, into thermal energy on the basis of the current flow and may also discharge it to the environment.

FIG. 1b shows a block diagram of a circuit of device 1 according to a second exemplary embodiment of the present invention. In contrast to the first exemplary embodiment, additional Zener diode 4 is connected in series between voltage source $V_{Gen}$ and MOSFET transistor 2. The overvoltage energy is reduced, i.e. the energy is converted, in the same manner as in the first exemplary embodiment described above.

FIG. 1c shows a block diagram of a circuit of device 1 according to a third exemplary embodiment of the present invention, without a series-connected Zener diode 4 being provided and with only semiconductor component 2 serving as the energy conversion component upon activation by trigger circuit 3.

Figure 3B:
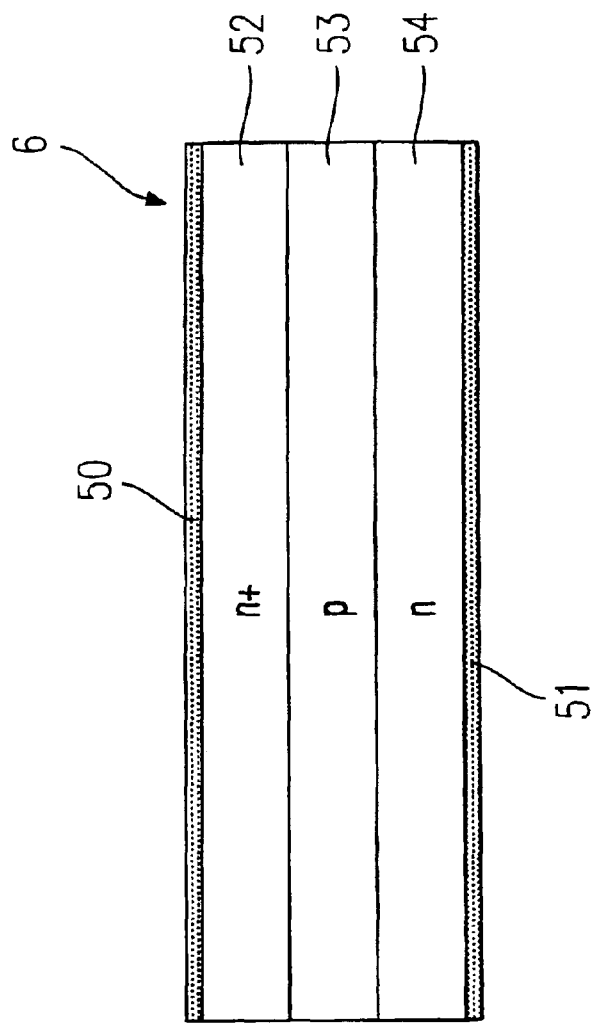
Figure 3A:
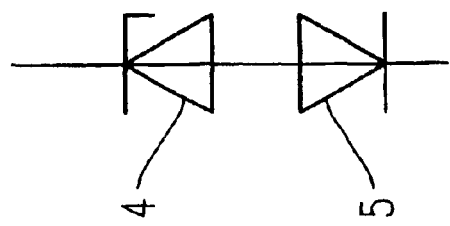
FIG. 3a shows a circuit diagram of a Zener diode and a rectifier diode connected in series.

To prevent Zener diode 4 from being destroyed in the first and second exemplary embodiments according to FIGS. 1a and 1b, Zener diode 4 may be connected in series to a rectifier diode 5, as illustrated in FIG. 3a. Rectifier diode 5 may be designed with a layer structure, including an n+-doped layer 52, a p-doped layer 53 and an n-doped layer 54 and is activatable via two metallization layers 50, 51.

Figure 4B:
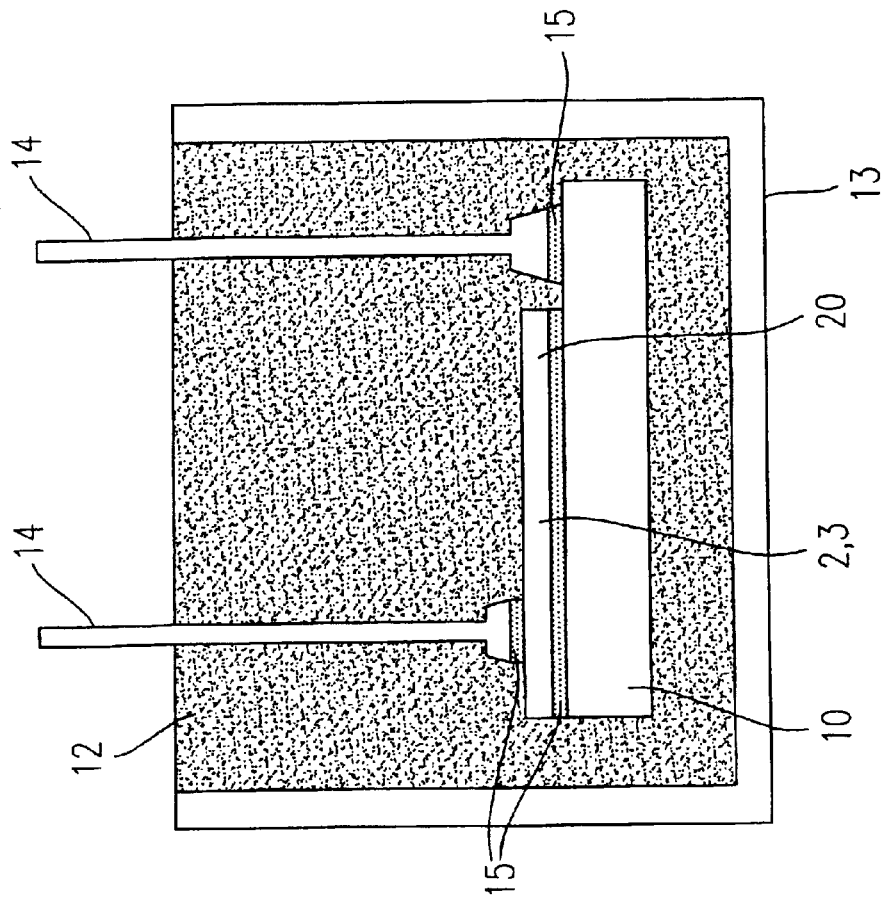
FIG. 4b shows a schematic representation of a further geometric arrangement of the device in conjunction with heat removal apparatuses according to the third exemplary embodiment shown in FIG. 1c.
Figure 4A:
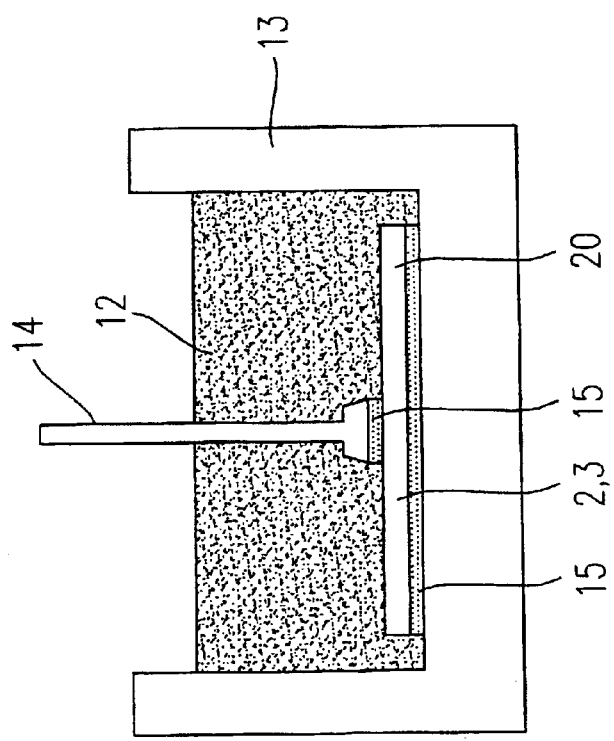
FIG. 4a shows a schematic representation of the device having heat removal apparatuses according to the third exemplary embodiment shown in FIG. 1c.

FIGS. 4a and 4b show two different geometric embodiments of protective device 1 according to the third exemplary embodiment illustrated in FIG. 1c, trigger circuit 3 and MOSFET transistor 2 being advantageously integrated on a common chip 20.

In FIG. 4a, chip 20, on which trigger circuit 3 and MOSFET transistor 2 are integrated, is provided in a container 13, which may be a highly conductive metal receptacle 13, for the purpose of removing the heat generated in the semiconductor component. Chip 20 is connected to metal receptacle 13 and leads 14 via soldered connections 15. A casting compound 12, advantageously an epoxy compound, is also provided in metal receptacle 13 and brought into contact with chip 20 for heat removal purposes.

FIG. 4b shows a further embodiment of a single-chip arrangement in which trigger circuit 3 and MOSFET transistor 2 are integrated on a single chip 20. Chip 20 is thermally contacted on the bottom with a highly thermally conductive metal body 10, for example a metal plate 10, via a soldered connection 15.

Leads 14, in turn, are attached to the corresponding components via soldered connections 15.

This arrangement is completely surrounded by a casting compound 12, which may be provided in a metal receptacle 13. This also ensures efficient heat removal from the semiconductor component to the materials surrounding it or to the environment.

Chips 20 may include solderable metal plating on both the front and back for soldered connection to leads 14.

Figure 5:
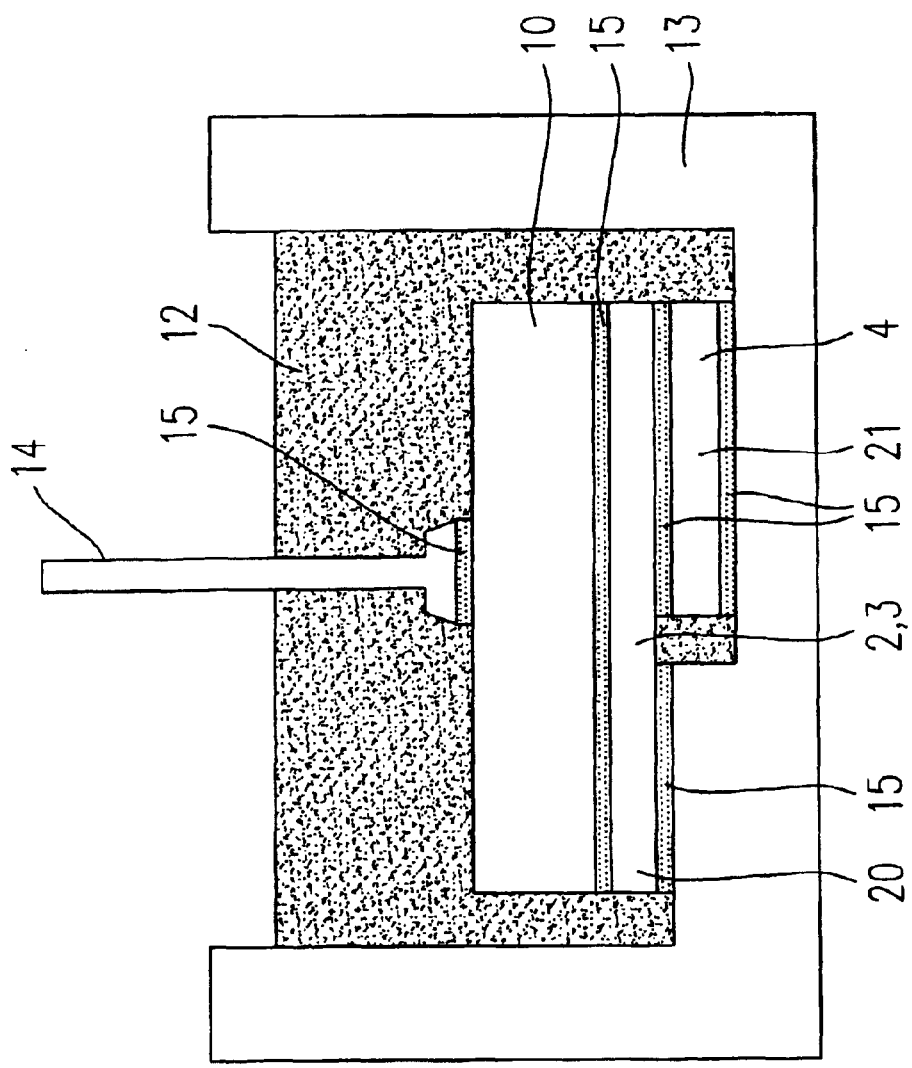
FIG. 5 shows a schematic cross-sectional view of the geometric arrangement of a device having heat removal apparatuses according to the first or second exemplary embodiment shown in FIGS. 1a and 1b, respectively.

FIG. 5 shows a schematic cross-sectional view of a device according to the present invention based on the first or second exemplary embodiment of the present invention illustrated in FIGS. 1a and 1b, respectively.

In this exemplary embodiment, the device is designed as a dual-chip arrangement, i.e., trigger circuit 3 and MOSFET transistor 2 are provided together on a single chip 20, and additional Zener diode 4 is integrated on an additional, separate chip 21.

In this exemplary embodiment, both chips 20, 21 are provided in a stacked arrangement, the corresponding electrical connections between chips 20, 21 being established by soldered connections 15. Semiconductor chips 20, 21 may also be interconnected by direct die bonding.

For the purpose of removing the heat generated in semiconductor components 2 and 4, chip 20 may be thermally connected to a metal body 10 on top and to a metal receptacle 13 at the exposed surfaces of the bottom.

For the purpose of heat removal, chip 21 also comes into contact with metal receptacle 13 on the bottom. Within metal receptacle 13, the arrangement is further surrounded by a casting compound 12.

Figure 6:
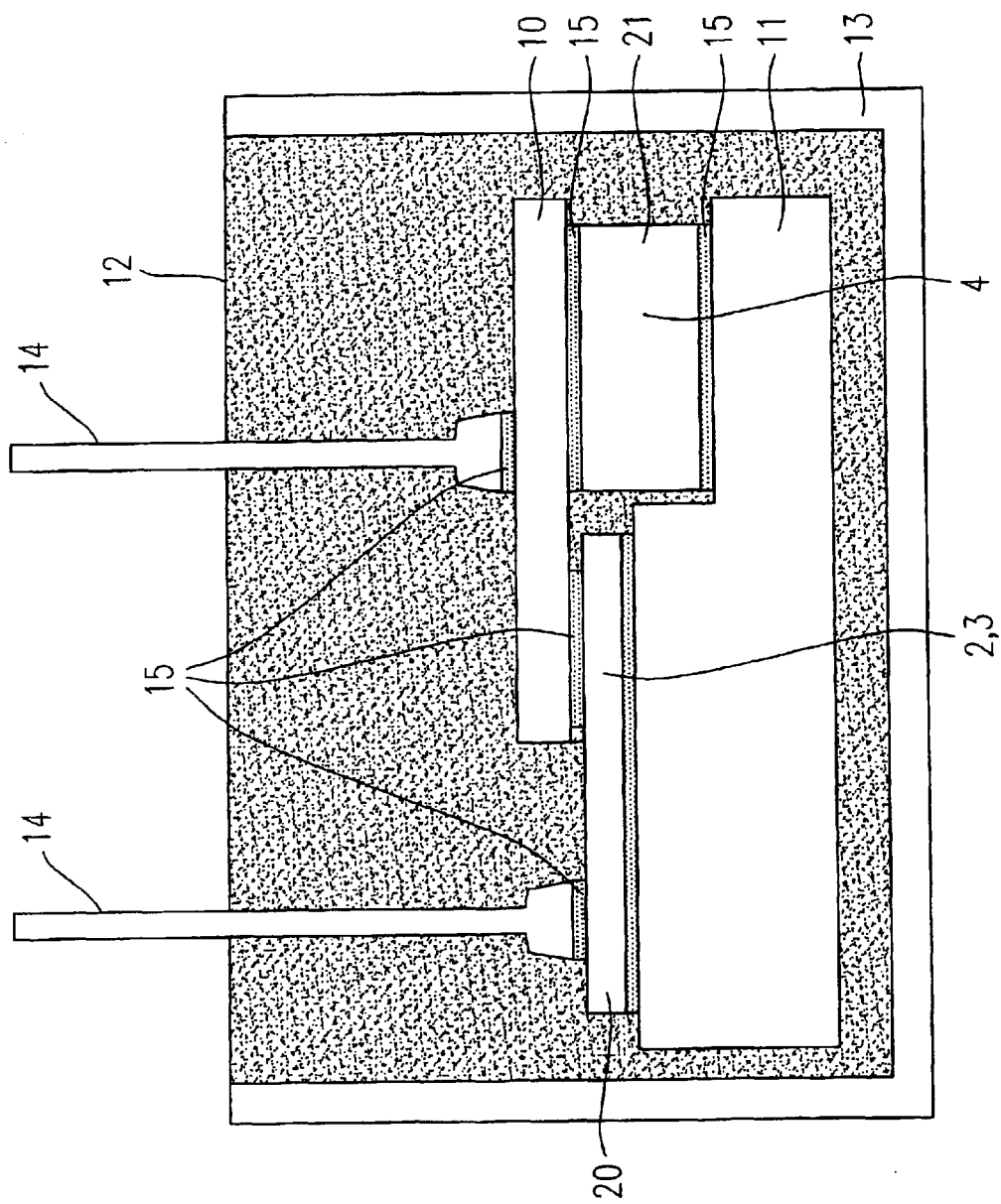
FIG. 6 shows a schematic cross-sectional view of a further geometric arrangement of the device having heat removal apparatuses according to the first or second exemplary embodiment shown in FIGS. 1a and 1b, respectively.

A further exemplary embodiment of the dual-chip arrangement is illustrated in FIG. 6. Once again, trigger circuit 3, MOSFET transistor 2 and additional Zener diode 4 are attached to, or integrated into, two mechanically separate chips 20, 21. In the exemplary embodiment according to FIG. 6, both chips 20, 21 are mounted side-by-side on a correspondingly shaped metal body 11 and interconnected by soldered connections 15 or directly by direct die bolding. A correspondingly shaped metal body 10, which is may be configured as a metal plate, is again provided for heat removal purposes on the surface of both chips 20, 21. The device described above is surrounded by a casting compound 12 and is again located in a metal receptacle 13 via which the dissipated heat is discharged to the environment.

In the dual-chip arrangement, leads 14 are soldered onto the chips, i.e. the metal plates, via soldered connections 15 to establish an electrical connection.

In contrast to the conventional approaches, the protective device according to the present invention is usable even at higher motor vehicle system voltages. This device is also economical to produce, easy to assemble due to the compact bipolar component, and thermally isolatable from a rectifier.

Although the present invention was described above on the basis of one preferred exemplary embodiment, it is not limited thereto, but may be modified in many different ways.

For example, a dual-chip arrangement is also implementable by integrating power MOSFET transistor 2 and trigger circuit 3 on mechanically separated chips. Depending on the cost of producing the power MOSFET transistor and the assembly costs, the single-chip arrangement (power MOSFET transistor with trigger circuit), a dual-chip arrangement (power MOSFET transistor with trigger circuit and Zener diode or power MOSFET transistor and trigger circuit on two separate chips) or a triple-chip arrangement (power MOSFET transistor, trigger circuit and Zener diode on separate chips) may be more economical to produce.

What is claimed is:

1. A device for protecting electronic components against overvoltages of a system voltage, comprising:

at least one semiconductor transistor, a trigger circuit configured to switch the at least one semiconductor transistor when a predetermined overvoltage value is reached, thereby converting electrical energy to thermal energy, and a Zener diode connectable in series to the at least one semiconductor transistor.

2. The device of claim 1, wherein the trigger circuit and the at least one semiconductor transistor are arranged as integrated circuits on a chip.

3. The device of claim 1 wherein the at least one semiconductor transistor and the Zener diode are arranged as integrated circuits on two separate chips.

4. The device of claim 3, wherein the two separate chips are arranged in a side-by-side configuration.

5. The device of claim 3, further comprising:

at least one heat removal device, wherein the heat removal device at least partially surrounds the two chips.

6. The device of claim 5, wherein the at least one heat removal apparatus includes at least one of a metal body, a casting compound and a metal receptacle.

7. The device of claim 6, wherein the casting compound includes an epoxy compound.

8. The device of claim 7, wherein the MOSFET transistor includes a vertical power MOSFET transistor and an integrated trigger circuit.

9. The device of claim 6, further comprising:

electrical connections, the electrical connections including at least one of soldered connections and direct die bonding connections.

10. The device of claim 1, wherein the at least one semiconductor transistor includes a MOSFET transistor.

11. The device of claim 1, wherein the at least one semiconductor transistor includes a vertical bipolar transistor having an integrated trigger circuit.

12. The device of claim 1, further comprising:

a rectifier diode, the rectifier diode being connected in series to the Zener diode.

13. The device of claim 12, wherein the Zener diode and the rectifier diode are integrated into a three-layer semiconductor element.

14. An electronic system of a motor vehicle for protecting electronic components against electrical overvoltages, comprising:

a protection device including at least one semiconductor transistor, a Zener diode connectable in series to the at least one semiconductor transistor, and a trigger circuit, the trigger circuit being configured to switch the at least one semiconductor transistor when a predetermined overvoltage value is reached, thereby converting electrical energy to thermal energy.

15. A method of protecting electronic components against electrical overvoltages, comprising:

providing at least one semiconductor transistor;

providing a Zener diode connectable in series to the at least one semiconductor transistor; and switching the at least one semiconductor transistor by means of a trigger circuit when a predetermined overvoltage value is reached, tbereby converting electrical energy to thermal energy.

* * * * *

UNITED STATES PATENT AND TRADEMARK OFFICE
CERTIFICATE OF CORRECTION

PATENT NO. : 6,727,555 B2
DATED : April 27, 2004
INVENTOR(S) : Holger Heinisch et al.

It is certified that error appears in the above-identified patent and that said Letters Patent is hereby corrected as shown below:

Column 6,
Line 1, change "claim 6," to -- claim 5 --

Signed and Sealed this

Eighth Day of February, 2005

JON W. DUDAS
*Director of the United States Patent and Trademark Office*